(12) United States Patent
Lee (10) Patent No.: US 12,327,828 B2
(45) Date of Patent: Jun. 10, 2025

(54) ELECTROSTATIC DISCHARGE CIRCUIT AND ELECTROSTATIC DISCHARGE CONTROL SYSTEM

(71) Applicant: SK hynix Inc., Icheon (KR)

(72) Inventor: Seung Ho Lee, Icheon (KR)

(73) Assignee: SK hynix Inc., Icheon (KR)

( * ) Notice: Subject to any disclaimer, the term of this patent is extended or adjusted under 35 U.S.C. 154(b) by 836 days.

(21) Appl. No.: 17/362,655

(22) Filed: Jun. 29, 2021

(65) Prior Publication Data

US 2022/0238509 A1    Jul. 28, 2022

(30) Foreign Application Priority Data

Jan. 28, 2021    (KR) .................... 10-2021-0012351

(51) Int. Cl.
*H01L 27/02* (2006.01)
*G05F 3/24* (2006.01)
*H02H 9/04* (2006.01)
*H03K 3/356* (2006.01)
*H03K 17/687* (2006.01)
(Continued)

(52) U.S. Cl.
CPC ........... *H01L 27/0266* (2013.01); *G05F 3/24* (2013.01); *H02H 9/046* (2013.01); *H03K 3/356113* (2013.01); *H03K 17/6872* (2013.01); *H03K 19/00315* (2013.01); *H03K 19/018521* (2013.01)

(58) Field of Classification Search
CPC .... G05F 3/24; H02H 9/046; H03K 3/356113; H03K 17/6872
See application file for complete search history.

(56) References Cited

U.S. PATENT DOCUMENTS 5,729,155 A    3/1998 Kobatake
5,736,869 A    4/1998 Wei
(Continued)

FOREIGN PATENT DOCUMENTS

CN        108933589 A     12/2018
JP        2009-152944 A   7/2009
(Continued)

OTHER PUBLICATIONS

Kumar et al., "Power Sequence free 400Mbps 90μW 6000μm2 1.8V-3.3V Stress Tolerant I/O Buffer in 28nm CMOS", 2013, pp. 37-40, IEEE.
(Continued)

*Primary Examiner* — Adolf D Berhane
*Assistant Examiner* — Afework S Demisse (57) ABSTRACT

An electrostatic discharge circuit may include a control voltage generation circuit, an electrostatic detection circuit, a driving control circuit and a discharge driving circuit. The control voltage generation circuit may generate first to third control voltages through a division operation on a supply voltage. The electrostatic detection circuit may set a first setup voltage based on the first control voltage, and detect static electricity transferred through the first setup voltage. The driving control circuit may set a second setup voltage based on the second control voltage, and generate a driving control signal. The discharge driving circuit may set a third setup voltage based on the third control voltage, and perform a discharge operation on static electricity.

26 Claims, 6 Drawing Sheets

(51) Int. Cl.
   *H03K 19/003* (2006.01)
   *H03K 19/0185* (2006.01)

(56) References Cited

U.S. PATENT DOCUMENTS

| | | | |
|---|---|---|---|
| 5,818,257 A | 10/1998 | Nuccio | |
| 5,821,800 A | 10/1998 | Le et al. | |
| 5,995,010 A | 11/1999 | Blake et al. | |
| 6,054,875 A | 4/2000 | Wayner | |
| 6,157,223 A | 12/2000 | Blake | |
| 6,208,167 B1 | 3/2001 | Ranjan et al. | |
| 6,373,282 B1 | 4/2002 | Drapkin et al. | |
| 6,424,510 B1 | 7/2002 | Ajit et al. | |
| 6,690,555 B1 | 2/2004 | Pasqualini | |
| 6,731,151 B1 | 5/2004 | Doutreloigne | |
| 6,801,064 B1 | 10/2004 | Hunt et al. | |
| 6,836,148 B2 | 12/2004 | Pullen et al. | |
| 6,980,035 B1 | 12/2005 | Zhou et al. | |
| 7,005,913 B2 | 2/2006 | Diffenderfer | |
| 7,027,332 B2 | 4/2006 | Kuo et al. | |
| 7,034,573 B1 | 4/2006 | Chang | |
| 7,053,657 B1 | 5/2006 | Peng | |
| 7,205,819 B2 | 4/2007 | Davis | |
| 7,215,146 B2 | 5/2007 | Khan | |
| 7,233,178 B2 | 6/2007 | Yu et al. | |
| 7,295,038 B2 | 11/2007 | Seo | |
| 7,504,862 B2 | 3/2009 | De Sandre et al. | |
| 7,521,966 B2 | 4/2009 | Chong et al. | |
| 7,724,045 B2 | 5/2010 | Ueno | |
| 7,755,393 B1 | 7/2010 | Song | |
| 8,212,590 B2 | 7/2012 | Wang et al. | |
| 8,466,722 B2 | 6/2013 | Kossel et al. | |
| 8,536,925 B2 | 9/2013 | Bhattacharya et al. | |
| 8,994,412 B2 | 3/2015 | Kim | |
| 9,876,003 B2 * | 1/2018 | Chen | H02H 9/046 |
| 9,893,517 B2 | 2/2018 | Dey et al. | |
| 10,027,325 B1 | 7/2018 | Graves | |
| 10,177,764 B2 | 1/2019 | Chern et al. | |
| 10,305,474 B2 | 5/2019 | Lee | |
| 10,348,301 B2 | 7/2019 | Lee | |
| 10,511,304 B2 | 12/2019 | Pan et al. | |
| 10,659,047 B2 | 5/2020 | Lee | |
| 10,848,154 B2 | 11/2020 | Lee | |
| 10,892,750 B2 | 1/2021 | Lee | |
| 11,101,799 B2 | 8/2021 | Lee | |
| 11,296,694 B2 | 4/2022 | Lee | |
| 11,424,615 B2 | 8/2022 | Meng et al. | |
| 11,646,737 B1 | 5/2023 | Chan et al. | |
| 11,799,482 B2 | 10/2023 | Lee | |
| 2003/0222682 A1 | 12/2003 | Yu et al. | |
| 2004/0061525 A1 | 4/2004 | Tamaki | |
| 2005/0219778 A1 | 10/2005 | Shigenari | |
| 2005/0286187 A1 | 12/2005 | Liu et al. | |
| 2006/0072267 A1 | 4/2006 | Chatty et al. | |
| 2006/0091907 A1 | 5/2006 | Khan | |
| 2007/0014061 A1 | 1/2007 | Chang et al. | |
| 2009/0015974 A1 * | 1/2009 | Wang | H01L 27/0262 |
| | | | 361/111 |
| 2009/0085639 A1 | 4/2009 | Ueno | |
| 2010/0176848 A1 | 7/2010 | Du et al. | |
| 2010/0271118 A1 | 10/2010 | Bhattacharya | |
| 2011/0025380 A1 | 2/2011 | Kim et al. | |
| 2011/0187431 A1 | 8/2011 | Bhattacharya et al. | |
| 2011/0298519 A1 | 12/2011 | Liu | |
| 2012/0300349 A1 | 11/2012 | Abou-Khalil et al. | |
| 2013/0135014 A1 | 5/2013 | Lin et al. | |
| 2014/0002146 A1 | 1/2014 | Kim | |
| 2015/0288173 A1 * | 10/2015 | Chen | H01L 27/0285 |
| | | | 361/56 |
| 2016/0079844 A1 | 3/2016 | Kinzer et al. | |
| 2017/0221879 A1 | 8/2017 | Wang et al. | |
| 2017/0346277 A1 * | 11/2017 | Su | H01L 27/0285 |
| 2018/0109255 A1 | 4/2018 | Lee | |
| 2018/0316185 A1 | 11/2018 | Lai et al. | |
| 2018/0343008 A1 | 11/2018 | Lee | |
| 2021/0281067 A1 | 9/2021 | Chen et al. | |
| 2021/0409019 A1 | 12/2021 | Lee | |
| 2022/0231686 A1 | 7/2022 | Lee | |
| 2022/0352712 A1 | 11/2022 | Lee et al. | |
| 2023/0223394 A1 | 7/2023 | Stockinger et al. | |

FOREIGN PATENT DOCUMENTS

| | | |
|---|---|---|
| JP | 2010-004424 A | 1/2010 |
| KR | 1020180128600 A | 12/2018 |

OTHER PUBLICATIONS

Rajagopal et al., "Dynamically Biased Low Power High Performance 3.3V Output Buffer in a Single Well Bulk CMOS 1.8V Oxide 45nm Process", 13th Int'l Symposium on Quality Electronic Design, 2012, IEEE.

Rajagopal et al., "An Enhanced Topology for Reliability of a High Performance 3.3V I/O Buffer in a Single-well Bulk CMOS 1.8v-oxide Low voltage Process", 10th Int'l Symposium on Quality Electronic Design, 2009, IEEE.

Marcs NG, "3.3V Transmitter Using 1.8V Transistors In A Cascode Configuration", Theses and dissertations, Paper 2056, Jan. 1, 2013, pp. 1-41.

1 Office Action dated Aug. 9, 2021 for U.S. Appl. No. 17/076,474.
Office Action dated Aug. 3, 2023 for U.S. Appl. No. 17/732,337.
Notice of Allowance dated Feb. 15, 2024, for U.S. Appl. No. 17/732,337.
The Office Action dated Apr. 18, 2024, for U.S. Appl. No. 18/471,094.

* cited by examiner

ELECTROSTATIC DISCHARGE CIRCUIT AND ELECTROSTATIC DISCHARGE CONTROL SYSTEM

CROSS-REFERENCES TO RELATED APPLICATION

The present application claims priority under 35 U.S.C. § 119(a) to Korean patent application number 10-2021-0012351, filed on Jan. 28, 2021, in the Korean Intellectual Property Office, which is incorporated herein by reference in its entirety.

BACKGROUND

1. Technical Field

Various embodiments generally relate to an electrostatic discharge circuit and an electrostatic discharge control system, and more particularly, to an electrostatic discharge circuit and an is electrostatic discharge control system, which can protect internal circuits of an integrated circuit from static electricity contained in power.

2. Related Art

In general, an integrated circuit including a semiconductor apparatus receives power, and performs various circuit operations. In order to stably perform the various circuit operations, the integrated circuit needs to receive stable power. However, the power applied to the integrated circuit may contain undesired static electricity having a high voltage.

Recently, with the development of technology, internal circuits mounted on the integrated circuit have been gradually reduced in size and highly integrated. In such a situation, a high voltage of static electricity included in power accompanies potentially destructive effects on the internal circuits. In particular, the high voltage of the static electricity may destruct a gate dielectric layer of a metal oxide semiconductor (MOS) transistor included in an internal circuit. Therefore, the integrated circuit includes an ESD (Electro-Static Discharge) circuit for protecting the internal circuits from the high voltage of the static electricity.

SUMMARY

In an embodiment, an electrostatic discharge circuit may include: a control voltage generation circuit configured to generate a first control voltage, a second control voltage, and a third control is voltage by dividing a supply voltage; an electrostatic detection circuit configured to set a first setup voltage based on the first control voltage, and generate an electrostatic detection signal by detecting static electricity contained in the first setup voltage; a driving control circuit configured to set a second setup voltage based on the second control voltage, and generate a driving control signal based on the electrostatic detection signal; and a discharge driving circuit configured to set a third setup voltage based on the third control voltage, and perform a discharge operation on static electricity contained in the third setup voltage based on the driving control signal.

In an embodiment, an electrostatic discharge control system may include: a first electrostatic discharge circuit configured to perform a discharge operation on static electricity contained in a first supply voltage; a second electrostatic discharge circuit configured to perform a discharge operation on static electricity contained in a second supply voltage, the first supply voltage having a higher voltage level than the second supply voltage; and a selection control circuit configured to selectively control the first or second electrostatic discharge circuit based on a selected supply voltage of the first and second supply voltages, the selected supply voltage being applied to a supply voltage terminal.

In an embodiment, an electrostatic discharge control system may include: a control signal generation circuit configured to generate a selection control signal based on a selected supply voltage is of a first supply voltage and a second supply voltage, the selected supply voltage being applied to a supply voltage terminal; a control voltage generation circuit activated in response to the selection control signal when the selected supply voltage is the first supply voltage and configured to generate a first control voltage, a second control voltage, and a third control voltage by dividing the selected supply voltage; a first setup circuit configured to receive the selected supply voltage and generate a first setup voltage based on one of the first control voltage and the selection control signal; a detection circuit configured to detect static electricity contained in the first setup voltage and output an electrostatic detection signal; a second setup circuit configured to receive the selected supply voltage and generate a second setup voltage based on one of the second control voltage and the selection control signal; a driving circuit configured to generate a driving control signal based on the electrostatic detection signal; a third setup circuit configured to receive the selected supply voltage and generate a third setup voltage based on one of the third control voltage and the selection control signal; and a discharge circuit configured to form a discharge path for the third setup voltage based on the driving control signal.

In an embodiment, an electrostatic discharge circuit may include: a bias generation circuit configured to generate a bias voltage; an electrostatic sensing circuit configured to sense static electricity contained in a supply voltage and generate a driving control signal; and a discharge driving circuit configured to set a is setup voltage based on the bias voltage, and perform a discharge operation on static electricity contained in the setup voltage based on the driving control signal.

DETAILED DESCRIPTION

The description of the present disclosure is merely an embodiment for a structural and/or functional description.

The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of the steps, symbols (e.g., a, b, and c) are used for convenience of description, and the symbols do not describe an order of the steps. The steps may be performed in an order different from the order described in the context unless a specific order is clearly described in the context. That is, the steps may be performed according to a described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

Various embodiments are directed to an electrostatic discharge circuit which includes low voltage transistors and can protect an internal circuit of an integrated circuit from static electricity contained in a supply voltage.

Also, various embodiments are directed to an electrostatic discharge control system which can protect an internal circuit of an integrated circuit from static electricity contained in multiple supply voltages.

Figure 1:
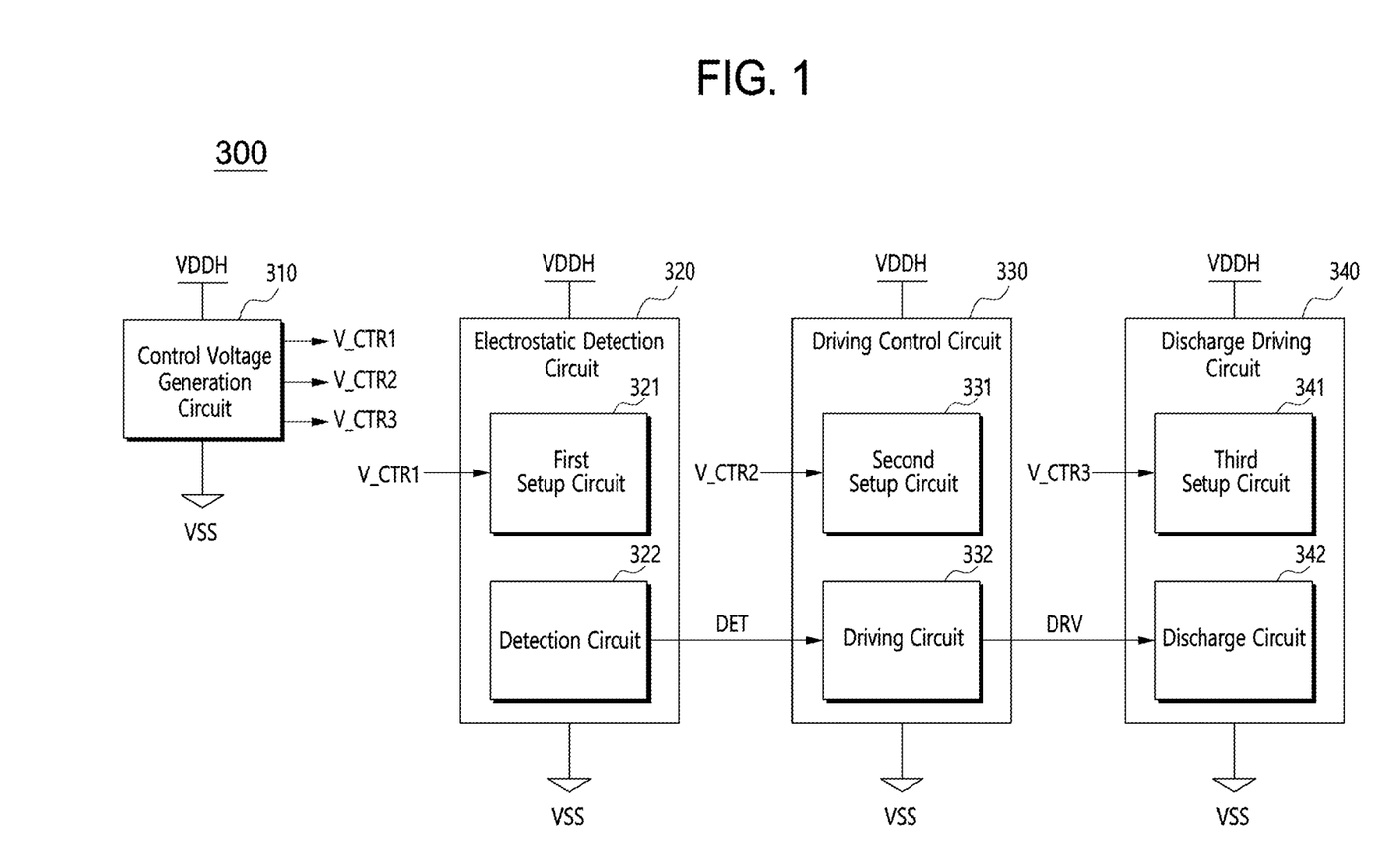
FIG. 1 is a block diagram illustrating an electrostatic discharge circuit in accordance with an embodiment.

FIG. 1 is a block diagram illustrating an electrostatic discharge circuit 300 in accordance with an embodiment.

Referring to FIG. 1, the electrostatic discharge circuit 300 may be configured to sense and discharge static electricity contained in a supply voltage VDDH. More specifically, the electrostatic discharge circuit 300 may include a control voltage generation circuit 310, an electrostatic detection circuit 320, a driving control circuit 330, and a discharge driving circuit 340.

The control voltage generation circuit 310 may be configured to generate first to third control voltages V_CTR1 to V_CTR3 by dividing the supply voltage VDDH. The supply voltage VDDH may have a relatively high voltage level. For example, the supply voltage VDDH may be higher than an allowable voltage of a low voltage transistor included in the electrostatic discharge circuit 300. For example, the supply voltage VDDH may be one of approximately 3.3V±10%, approximately 2.5V±10%, and approximately 1.8V±10%. For reference, a supply voltage having a relatively low voltage level, which will be described below, may include the allowable voltage of the low voltage transistor. For example, the supply voltage having a relatively low voltage level may be one of approximately 1.8V±10%, approximately 1.2V±10%, and approximately 0.8V±10%. The control voltage generation circuit 310 may be coupled between a supply voltage terminal to which the supply voltage VDDH is applied and a ground voltage terminal to which a ground voltage VSS is applied.

Figure 2:
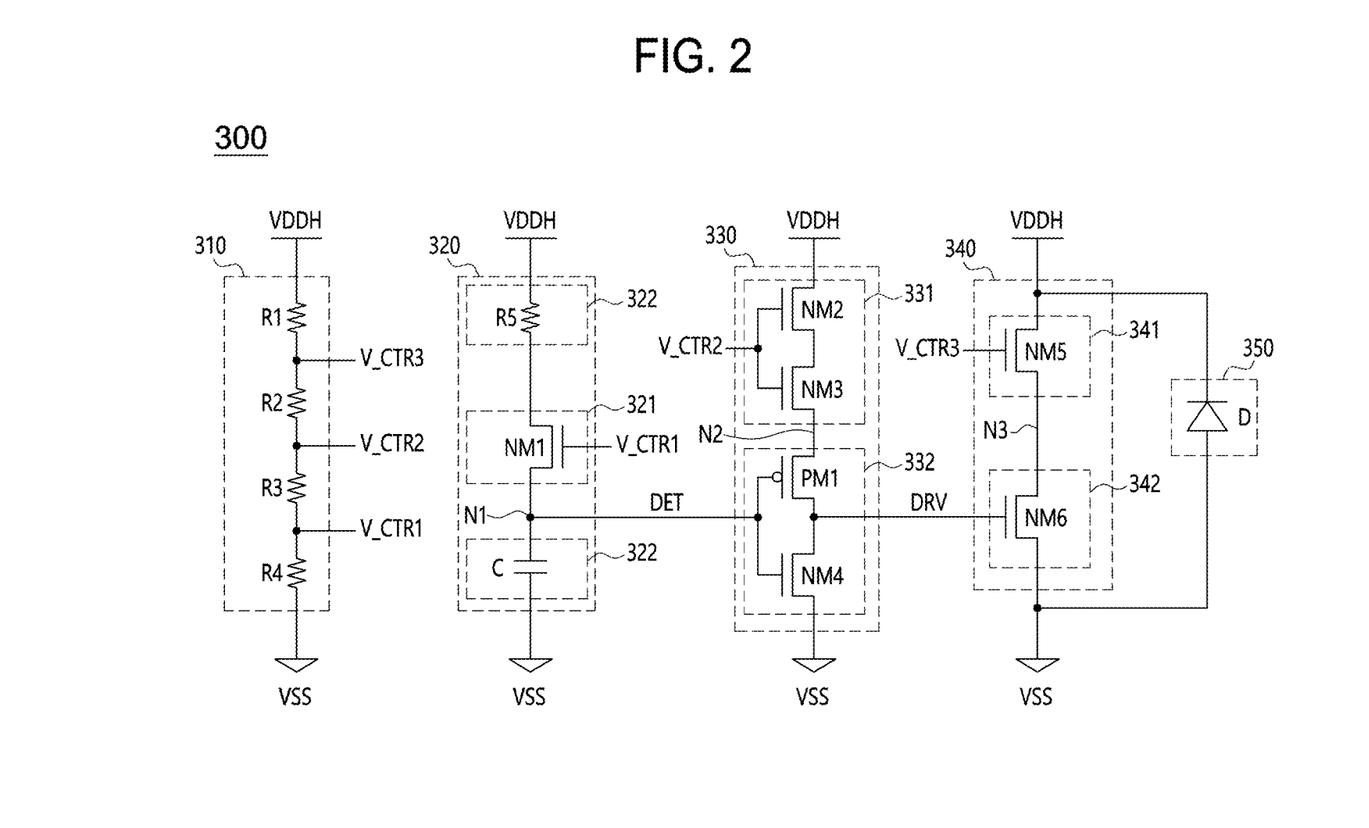
FIG. 2 is a circuit diagram illustrating the electrostatic discharge circuit of FIG. 1.

The first to third control voltages V_CTR1 to V_CTR3 generated by the control voltage generation circuit 310 may have the is same voltage level. Furthermore, at least one of the first to third control voltages V_CTR1 to V_CTR3 may have a different voltage level from the other ones of the first to third control voltages V_CTR1 to V_CTR3. FIG. 2 illustrates the first to third control voltages V_CTR1 to V_CTR3 that have different voltage levels from one another.

The electrostatic detection circuit 320 may be configured to set a first setup voltage based on the first control voltage V_CTR1, and detect static electricity contained in the first setup voltage. The electrostatic detection circuit 320 may generate an electrostatic detection signal DET by detecting the static electricity. The electrostatic detection circuit 320 may be coupled between the supply voltage terminal and the ground voltage terminal. More specifically, the electrostatic detection circuit 320 may include a first setup circuit 321 and a detection circuit 322.

The first setup circuit 321 may be configured to receive the supply voltage VDDH, and generate the first setup voltage based on the first control voltage V_CTR1. The detection circuit 322 may be configured to detect the static electricity contained in the first setup voltage, and output the electrostatic detection signal DET. The detailed circuit configurations of the first setup circuit 321 and the detection circuit 322 will be described below with reference to FIG. 2.

The driving control circuit 330 may be configured to set a second setup voltage based on the second control voltage V_CTR2, and generate a driving control signal DRV based on the electrostatic is detection signal DET. The driving control circuit 330 may be coupled between the supply voltage terminal and the ground voltage terminal. More specifically, the driving control circuit 330 may include a second setup circuit 331 and a driving circuit 332.

The second setup circuit 331 may be configured to receive the supply voltage VDDH, and generate the second setup voltage based on the second control voltage V_CTR2. The driving circuit 332 may be configured to generate the driving control signal DRV based on the electrostatic detection signal DET. The detailed circuit configurations of the second setup circuit 331 and the driving circuit 332 will be described below with reference to FIG. 2.

The discharge driving circuit 340 may be configured to set a third setup voltage based on the third control voltage V_CTR3, and perform a discharge operation on static electricity contained in the third setup voltage based on the driving control signal DRV. The discharge driving circuit 340 may be coupled between the supply voltage terminal and the ground voltage terminal. More specifically, the discharge driving circuit 340 may include a third setup circuit 341 and a discharge circuit 342.

The third setup circuit 341 may be configured to receive the supply voltage VDDH, and generate the third setup voltage based on the third control voltage V_CTR3. The discharge circuit 342 may be configured to form a discharge path for the third setup voltage based on the driving control signal DRV. The detailed circuit configurations of the third setup circuit 341 and the discharge circuit 342 will be is described below with reference to FIG. 2.

FIG. 2 is a circuit diagram illustrating the electrostatic discharge circuit 300 of FIG. 1.

Referring to FIG. 2, the electrostatic discharge circuit 300 may include the control voltage generation circuit 310, the electrostatic detection circuit 320, the driving control circuit 330, and the discharge driving circuit 340.

The control voltage generation circuit 310 may include first to fourth resistors R1 to R4 coupled in series between the supply voltage terminal and the ground voltage terminal.

The first to fourth resistors R1 to R4 may generate the first to third control voltages V_CTR1 to V_CTR3 by dividing the supply voltage VDDH. The third control voltage V_CTR3 may be outputted from a node to which the first and second resistors R1 and R2 are coupled in common, the second control voltage V_CTR2 may be outputted from a node to which the second and third resistors R2 and R3 are coupled in common, and the first control voltage V_CTR1 may be outputted from a node to which the third and fourth resistors R3 and R4 are coupled in common. Therefore, the first to third control voltages V_CTR1 to V_CTR3 may have different voltage levels. Furthermore, the first to third control voltages V_CTR1 to V_CTR3 may have voltage levels which are sequentially reduced from a voltage level of the supply voltage VDDH. That is, among the first to third control voltages V_CTR1 to V_CTR3, the third control voltage V_CTR3 may have the highest voltage level, the second control is voltage V_CTR2 may have the second highest voltage level, and the first control voltage V_CTR1 may have the lowest voltage level.

The control voltage generation circuit 310 having the above-described configuration may generate the first to third control voltages V_CTR1 to V_CTR3 by dividing the supply voltage VDDH.

According to another embodiment, the control voltage generation circuit 310 may include first to third resistors R1 to R3 coupled in series between the supply voltage terminal and the ground voltage terminal. The first to third resistors R1 to R3 may generate the first to third control voltages V_CTR1 to V_CTR3 by dividing the supply voltage VDDH. In an embodiment, the first and second control voltages V_CTR1 and V_CTR2 may have the same voltage level. In another embodiment, the second and third control voltages V_CTR2 and V_CTR3 may have the same voltage level.

The electrostatic detection circuit 320 may include the detection circuit 322 and the first setup circuit 321. The electrostatic detection circuit 320 may include a fifth resistor R5, a first NMOS transistor NM1, and a capacitor C, which are coupled in series between the supply voltage terminal and the ground voltage terminal. The first NMOS transistor NM1 may be included in the first setup circuit 321. The fifth resistor R5 and the capacitor C may be included in the detection circuit 322.

The first NMOS transistor NM1 may be coupled between the fifth resistor R5 and a first node N1, and configured to receive the first control voltage V_CTR1 through a gate terminal thereof. The is first NMOS transistor NM1 may be turned on in response to the first control voltage V_CTR1. Thus, the supply voltage VDDH may be transferred to the first node N1 as the first setup voltage through the fifth resistor R5 and the first NMOS transistor NM1 when the first NMOS transistor NM1 is turned on. Therefore, the first node N1 may receive the first setup voltage.

The capacitor C may be coupled between the first node N1 and the ground voltage terminal. The capacitor C may be opened or shorted according to a current characteristic of the first setup voltage transferred to the first node N1. In other words, the capacitor C may be opened when the first setup voltage of the first node N1 has a DC characteristic, and shorted when the first setup voltage of the first node N1 has an AC characteristic. That is, the capacitor C may be opened or shorted according to the characteristic of a current flowing through the first node N1.

More specifically, when no static electricity is contained in the supply voltage VDDH, the first setup voltage of the first node N1 may have the DC characteristic. At this time, the capacitor C may be opened. Therefore, the first node N1 may have a voltage level corresponding to the supply voltage VDDH or a similar voltage level to the supply voltage VDDH. On the other hand, when static electricity is contained in the supply voltage VDDH, the voltage level of the supply voltage VDDH is instantaneously changed by a high voltage of the static electricity. Thus, the first setup voltage of the first node N1 may have the AC characteristic. At this time, the capacitor C may be shorted. Therefore, the first node N1 may have a voltage level corresponding to the ground voltage VSS or a similar voltage level to the ground voltage VSS.

That is, the first node N1 may have a voltage level changing according to whether static electricity is contained in the supply voltage VDDH or not. The changing voltage level at the first node N1 is output as the electrostatic detection signal DET, and thus the electrostatic detection signal DET indicates whether static electricity is contained in the supply voltage VDDH or not.

The electrostatic detection circuit 320 having the above-described configuration may provide the first setup voltage to the first node N1 in response to the first control voltage V_CTR1. The electrostatic detection circuit 320 may generate the electrostatic detection signal DET by detecting static electricity contained in the first setup voltage on the first node N1.

The driving control circuit 330 may include the second setup circuit 331 and the driving circuit 332. The driving control circuit 330 may include a second NMOS transistor NM2, a third NMOS transistor NM3, a first PMOS transistor PM1 and a fourth NMOS transistor NM4, which are coupled in series between the supply voltage terminal and the ground voltage terminal. The second and third NMOS transistors NM2 and NM3 may be included in the second setup circuit 331. The first PMOS transistor PM1 and the fourth NMOS transistor NM4 may be included in the driving circuit 332.

The second and third NMOS transistors NM2 and NM3 may is be coupled in series between a second node N2 and the supply voltage terminal to, and receive the second control voltage V_CTR2 through gate terminals thereof. The second and third NMOS transistors NM2 and NM3 may be turned on in response to the second control voltage V_CTR2. Thus, the supply voltage VDDH may be transferred to the second node N2 as the second setup voltage through the second and third NMOS transistors NM2 and NM3. Therefore, the second node N2 may receive the second setup voltage.

The first PMOS transistor PM1 and the fourth NMOS transistor NM4 may be coupled in series between the second node N2 and the ground voltage terminal, and receive the electrostatic detection signal DET through gate terminals thereof. Thus, when the electrostatic detection signal DET has a voltage level corresponding to a logic high level, the fourth NMOS transistor NM4 may be turned on. On the other hand, when the electrostatic detection signal DET has a voltage level corresponding to a logic low level, the first PMOS transistor PM1 may be turned on.

As described above, the electrostatic detection signal DET may have a voltage level corresponding to the supply voltage VDDH when no static electricity is detected. That is, the electrostatic detection signal DET may have the logic high level when no static electricity is detected. Therefore, the fourth NMOS transistor NM4 may be turned on in response to the electrostatic detection signal DET having the logic high level. At this time, the driving control signal DRV may have a logic low level corresponding to the ground voltage VSS.

On the other hand, the electrostatic detection signal DET may have a voltage level corresponding to the ground voltage VSS when static electricity is detected. That is, the electrostatic detection signal DET may have the logic low level. Therefore, the first PMOS transistor PM1 may be turned on in response to the electrostatic detection signal DET having the logic low level. At this time, the driving control signal DRV may have a logic high level corresponding to the second setup voltage.

The driving control circuit 330 having the above-described configuration may provide the second setup voltage to the second node N2 in response to the second control voltage V_CTR2. Furthermore, the driving control circuit 330 may generate the driving control signal DRV based on the electrostatic detection signal DET.

The discharge driving circuit 340 may include the third setup circuit 341 and the discharge circuit 342. The discharge driving circuit 340 may include fifth and sixth NMOS transistors NM5 and NM6 coupled in series between the supply voltage terminal and the ground voltage terminal. The fifth NMOS transistor NM5 may be included in the third setup circuit 341. The sixth NMOS transistor NM6 may be included in the discharge circuit 342.

The fifth NMOS transistor NM5 may be coupled between a third node N3 and the supply voltage terminal, and receive the third control voltage V_CTR3 through a gate terminal thereof. The fifth NMOS transistor NM5 may be turned on in response to the third control voltage V_CTR3. The supply voltage VDDH may be transferred to the third node N3 as the third setup voltage through the fifth NMOS transistor NM5. Therefore, the third node N3 may receive the third setup voltage.

The sixth NMOS transistor NM6 may be coupled between the third node N3 and the ground voltage terminal, and receive the driving control signal DRV through a gate terminal thereof. When the driving control signal DRV has the logic low level, the sixth NMOS transistor NM6 may be turned off. On the other hand, when the driving control signal DRV has the logic high level, the sixth NMOS transistor NM6 may be turned on. Therefore, when the sixth NMOS transistor NM6 is turned on, the third node N3 and the ground voltage terminal may be coupled to each other. That is, the sixth NMOS transistor NM6 may form a discharge path for the third setup voltage on the third node N3 in response to the driving control signal DRV.

As described above, when no static electricity is detected, the driving control signal DRV may have the logic low level. The sixth NMOS transistor NM6 may be turned off in response to the driving control signal DRV having the logic low level. On the other hand, when static electricity is detected, the driving control signal DRV may have the logic high level. The sixth NMOS transistor NM6 may be turned on in response to the driving control signal DRV having the logic high level. At this time, the sixth NMOS transistor NM6 may form the discharge path. Therefore, the static electricity contained in the supply voltage VDDH may be discharged to the ground voltage terminal through the discharge path.

The discharge driving circuit 340 having the above-described configuration may provide the third setup voltage to the third node N3 in response to the third control voltage V_CTR3. Furthermore, the discharge driving circuit 340 may perform a discharge operation on the static electricity contained in the supply voltage VDDH based on the driving control signal DRV.

The electrostatic discharge circuit 300 in accordance with the present embodiment may use the supply voltage VDDH corresponding to a high voltage, e.g., 3.3V. The first to sixth NMOS transistors NM1 to NM6 and the first PMOS transistor PM1, which are included in the electrostatic discharge circuit 300, may be all implemented with low voltage transistors. The low voltage transistor may be a transistor which is used when implementing an integrated circuit using a low supply voltage, e.g., 1.8V.

In general, the low voltage transistor may occupy a smaller area and require a lower design cost than a high voltage transistor As described above, the electrostatic discharge circuit 300 may detect and discharge the static electricity contained in the supply voltage VDDH corresponding to a high voltage, while using the low voltage transistors. In other words, the electrostatic discharge circuit 300 in accordance with the present embodiment may not only perform the discharge operation on the static electricity contained in the supply voltage VDDH, but also reduce an area occupied by the electrostatic discharge circuit 300.

The reason why the low voltage transistors are used in the electrostatic discharge circuit 300 in accordance with the present embodiment may be described as follows.

In general, a transistor may have a reliability guarantee condition depending on an operation characteristic thereof. The low voltage transistor may perform a normal circuit operation only when voltage levels of source, drain, and gate terminals of the transistor satisfy the reliability guarantee condition. In an integrated circuit using a low supply voltage, e.g., 1.8V, a voltage difference $V_{gd}$ between the gate and drain terminals of the low voltage transistor, a voltage difference $V_{gs}$ between the gate and source terminals thereof, and a voltage difference $V_{ds}$ between the drain and source terminals thereof need to have 1.98V or less to satisfy the reliability guarantee condition. The electrostatic discharge circuit 300 in accordance with the present embodiment may receive the supply voltage VDDH of 3.3V corresponding to a high voltage, and the first to sixth NMOS transistors NM1 to NM6 and the first PMOS transistor PM1 may each maintain the reliability guarantee condition for the low voltage transistor.

Hereafter, for convenience of description, it is assumed that the first control voltage V_CTR1, the second control voltage V_CTR2, and the third control voltage V_CTR3, which are obtained by dividing the supply voltage VDDH of 3.3V, have 2.3V, 2.4V, and 2.5V, respectively. Furthermore, it is assumed that threshold voltages of is the first to sixth NMOS transistors NM1 to NM6 and the first PMOS transistor PM1 have 0.5V.

The first NMOS transistor NM1 may receive the first control voltage V_CTR1 of 2.3V through the gate terminal thereof. Therefore, a voltage difference $V_{gd}$ between the gate and drain terminals may become 1V (=3.3V−2.3V), a voltage difference Vgs between the gate and source terminals may become 0.5V (=2.3V−1.8V), and a voltage difference Vds between the drain and source terminals may become 1.5V (=3.3V−1.8V), under the supposition that the fifth resistor R5 is ignored. That is, the above voltage differences among the gate, drain, and source terminals of the first NMOS transistor NM1 may have voltage levels in a range of 1.98V or less, which corresponds to the reliability guarantee condition for the low voltage transistor.

The second NMOS transistor NM2 may receive the second control voltage V_CTR2 of 2.4V through the gate terminal thereof. Therefore, a voltage difference Vgd between the gate and drain terminals may become 0.9V (=3.3V−2.4V), a voltage difference Vgs between the gate and source terminals may become 0.5V (=2.4V−1.9V), and a voltage difference Vds between the drain and source terminals may become 1.4V (=3.3V−1.9V). That is, the above voltage differences among the gate, drain, and source terminals of the second NMOS transistor NM2 may have voltage levels in a range of 1.98V or less, which corresponds to the reliability guarantee condition for the low voltage transistor. Similarly, voltage differences among the gate, drain, and source terminals of each of the third is NMOS transistor NM3, the first PMOS transistor PM1, and the fourth NMOS transistor NM4 may have voltage levels in a range of 1.98V or less, which corresponds to the reliability guarantee condition for the low voltage transistor.

The fifth NMOS transistor NM5 may receive the third control voltage V_CTR3 of 2.5V through the gate terminal thereof. Therefore, a voltage difference Vgd between the gate and drain terminals may become 0.8V (=3.3V−2.5V), a voltage difference Vgs between the gate and source thereof may become 0.5V (=2.5V−2V), and a voltage difference Vds between the drain and source terminals may become 1.3V (=3.3V−2V). That is, the above voltage differences among the gate, drain, and source terminals of the fifth NMOS transistor NM5 may have voltage levels in a range of 1.98V or less, which corresponds to the reliability guarantee condition for the low voltage transistor. Similarly, voltage differences among the gate, drain, and source terminals of the sixth NMOS transistor NM6 may have voltage levels in a range of 1.98V or less, which corresponds to the reliability guarantee condition for the low voltage transistor.

In particular, in case of the fifth NMOS transistor NM5, a current Ids flowing from the drain terminal to the source terminal thereof may be maximized because the voltage level of the third control voltage V_CTR3 is 2.5V. That is, the electrostatic discharge circuit 300 in accordance with the present embodiment may maximize the current Ids flowing from the drain terminal to the source terminal of the fifth NMOS transistor NM5, thereby maximizing is the discharge efficiency for the static electricity.

The electrostatic discharge circuit 300 in accordance with the present embodiment may further include a reverse discharge circuit 350.

Referring to FIG. 2, the reverse discharge circuit 350 may be configured to discharge static electricity, contained in the ground voltage VSS, to the supply voltage terminal. The reverse discharge circuit 350 may be configured as a diode D coupled between the ground voltage terminal and the supply voltage terminal.

The electrostatic discharge circuit 300 in accordance with the present embodiment may perform a discharge operation on not only the static electricity contained in the supply voltage VDDH but also the static electricity contained in the ground voltage VSS.

Figure 3:
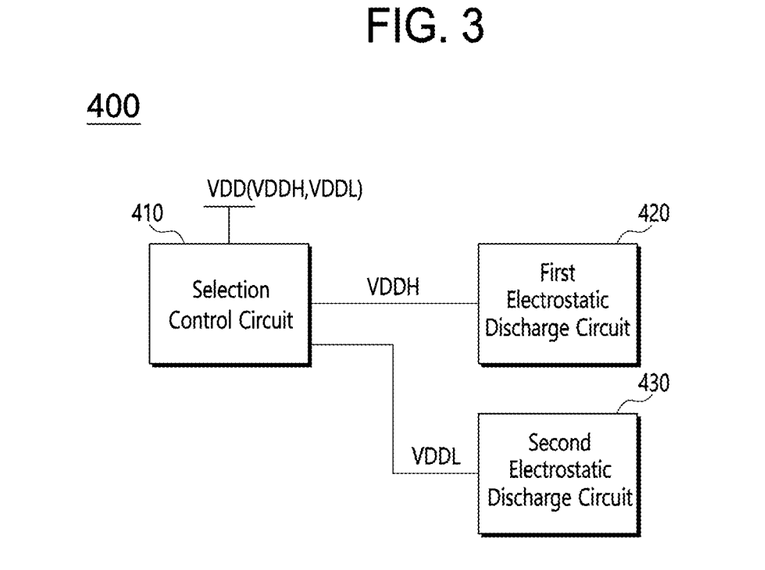
FIG. 3 illustrates an electrostatic discharge control system in accordance with an embodiment.

FIG. 3 is a block diagram illustrating an electrostatic discharge control system 400 in accordance with an embodiment.

Referring to FIG. 3, the electrostatic discharge control system 400 may be configured to perform a discharge operation on static electricity contained in multiple supply voltages in an integrated circuit. Hereafter, for convenience of description, the case in which a supply voltage terminal VDD receives a first supply voltage VDDH having one of approximately 3.3V±10%, approximately 2.5V±10%, and approximately 1.8V±10%, which correspond to high voltages, and receives a second supply voltage VDDL having one of approximately 1.8V±10%, approximately 1.2V±10%, and approximately 0.8V±10%, which correspond to low voltages. When the first supply voltage VDDH of 3.3V is applied to the supply voltage terminal VDD, the electrostatic discharge control system 400 may perform the discharge operation on static electricity contained in the first supply voltage VDDH. Furthermore, when the second supply voltage VDDL of 1.8V is applied to the supply voltage terminal VDD, the electrostatic discharge control system 400 may perform the discharge operation on static electricity contained in the second supply voltage VDDL. More specifically, the electrostatic discharge control system 400 may include a selection control circuit 410, a first electrostatic discharge circuit 420, and a second electrostatic discharge circuit 430.

The selection control circuit 410 may be configured to selectively control the first and second electrostatic discharge circuit 420 and 430 based on a supply voltage applied to the supply voltage terminal VDD between the first and second supply voltages VDDH and VDDL. The selection control circuit 410 may be designed to selectively activate the first and second electrostatic discharge circuits 420 and 430. For example, the selection control circuit 410 may selectively provide the first and second supply voltages VDDH and VDDL to the first and second electrostatic discharge circuits 420 and 430. That is, the selection control circuit 410 may provide the first supply voltage VDDH to the first electrostatic discharge circuit 420, and provide the second supply voltage VDDL to the second electrostatic discharge circuit 430. The first electrostatic discharge circuit 420 may be activated based on the first supply voltage VDDH provided thereto. The second electrostatic discharge circuit 430 may be activated based on the second supply voltage VDDL provided thereto.

Figure 4:
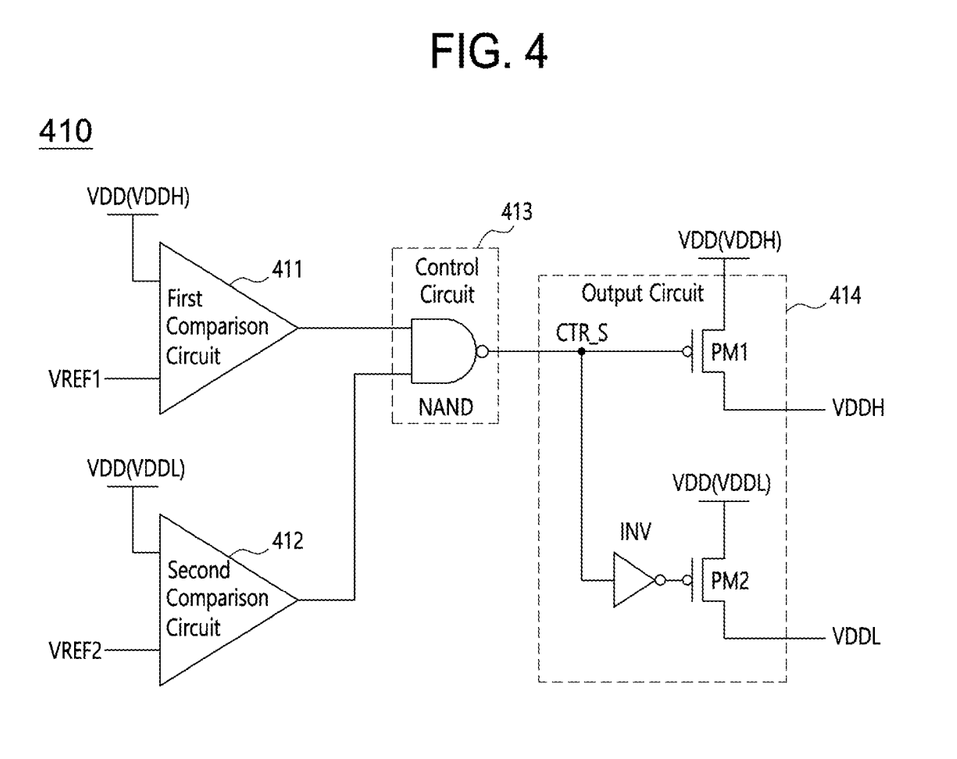
FIG. 4 illustrates a selection control circuit of FIG. 3.

FIG. 4 illustrates the selection control circuit 410 of FIG. 3.

Referring to FIG. 4, the selection control circuit 410 may include a first comparison circuit 411, a second comparison circuit 412, a control circuit 413, and an output circuit 414.

The first comparison circuit 411 may be configured to compare a supply voltage transferred to the supply voltage terminal VDD to a first reference voltage VREF1 corresponding to the first supply voltage VDDH. When the supply voltage applied to the supply voltage terminal VDD is lower than the first supply voltage VDDH, the first comparison circuit 411 may generate a first comparison signal having a logic low level. When the first supply voltage VDDH is applied to the supply voltage terminal VDD, the first comparison circuit 411 may generate the first comparison signal having a logic high level.

The second comparison circuit 412 may be configured to compare a supply voltage transferred to the supply voltage terminal VDD to a second reference voltage VREF2 corresponding to the second supply voltage VDDL. When the supply voltage applied to the supply voltage terminal VDD is lower than the second supply voltage VDDL, the second comparison circuit 412 may generate a second comparison signal having a logic low level. When the second supply voltage VDDL is applied to the supply voltage terminal VDD, the second comparison circuit 412 may generate the second comparison signal having a logic high level.

The control circuit 413 may be configured to generate a selection control signal CTR_S based on the first and second comparison signals of the first and second comparison circuits 411 and 412. The control circuit 413 may include a NAND gate NAND. The NAND gate NAND may receive the first and second comparison signals of the first and second comparison circuits 411 and 412, perform a NAND operation on the received signals, and output the selection control signal CTR_S.

The output circuit 414 may selectively output, as an output voltage, the first or second supply voltage VDDH or VDDL in response to the selection control signal CTR_S. More specifically, the output circuit 414 may include a first PMOS transistor PM1, an inverter INV, and a second PMOS transistor PM2.

The first PMOS transistor PM1 may receive the selection control signal CTR_S through a gate terminal thereof. The first PMOS transistor PM1 may be turned on when the selection control signal CTR_S has a logic low level. When the first PMOS transistor PM1 is turned on, the first supply voltage VDDH applied to the supply voltage terminal VDD may be outputted as the output voltage. The inverter INV may invert the selection control signal CTR_S and output an inverted selection control signal. Then, the second PMOS transistor PM2 may receive the inverted selection control signal through a gate terminal thereof. The second PMOS transistor PM2 may be turned on when the inverted selection control signal has a logic low level. When the second PMOS transistor PM2 is turned on, the second supply voltage VDDL applied to the supply voltage terminal VDD may be outputted as the output voltage.

Hereafter, a circuit operation of the selection control circuit 410 will be described with reference to FIG. 4.

In the following descriptions, the case in which the second supply voltage VDDL corresponding to a low voltage is applied to the supply voltage terminal VDD will be taken as an example.

The second comparison circuit 412 may receive the second supply voltage VDDL, compare the second supply voltage VDDL to the second reference voltage VREF2, and output the second comparison signal having the logic high level. At this time, the first comparison circuit 411 may generate the first comparison output signal having the logic low level because the first reference voltage VREF1 has a higher voltage level than the second supply voltage VDDL applied to the supply voltage terminal VDD. Then, the NAND gate NAND may output the selection control signal CTR_S having the logic high level based on the first comparison signal having the logic low level and the second comparison signal having the logic high level. Thus, the second PMOS transistor PM2 may be turned on in response to the selection control signal CTR_S having the logic high level, and output the second supply voltage VDDL as the output voltage. At this time, the first PMOS transistor PM1 may maintain a turn-off state.

Next, the case in which the first supply voltage VDDH corresponding to a high voltage is applied to the supply voltage terminal VDD will be described as follows.

The first comparison circuit 411 may receive the first supply voltage VDDH, compare the first supply voltage VDDH to the first reference voltage VREF1, and output the first comparison signal having the logic high level. At this time, the second comparison circuit 412 may generate the second comparison signal having the logic high level because the first supply voltage VDDH applied to the supply voltage terminal VDD has a higher voltage level than the second reference voltage VREF2. Then, the NAND gate NAND may output the selection control signal CTR_S having the logic low level based on the first comparison signal having the logic high level and the second comparison signal having the logic high level. Thus, the first PMOS transistor PM1 may be turned on in response to the selection control signal CTR_S having the logic low level, and output the first supply voltage VDDH as the output voltage. At this time, the second PMOS transistor PM2 may maintain a turn-off state.

When the first supply voltage VDDH is applied to the supply voltage terminal VDD, the selection control circuit 410 having the above-described configuration may provide the first supply voltage VDDH to the first electrostatic discharge circuit 420 of FIG. 3. On the other hand, when the second supply voltage VDDL is applied to the supply voltage terminal VDD, the selection control circuit 410 may provide the second supply voltage VDDL to the second electrostatic discharge circuit 430 of FIG. 3.

Referring back to FIG. 3, the first electrostatic discharge circuit 420 may be activated by the first supply voltage VDDH received from the selection control circuit 410. The first electrostatic discharge circuit 420 may perform a discharge operation on static electricity contained in the first supply voltage VDDH. The first electrostatic discharge circuit 420 may correspond to the electrostatic discharge circuit 300 of FIGS. 1 and 2. That is, the first electrostatic discharge circuit 420 may include the control voltage generation circuit 310, the electrostatic detection circuit 320, the driving control circuit 330, and the discharge driving circuit 340 described with reference to FIGS. 1 and 2.

On the other hand, the second electrostatic discharge circuit 430 may be activated by the second supply voltage VDDL received from the selection control circuit 410. The second electrostatic discharge circuit 430 may perform a discharge operation on static electricity contained in the second supply voltage VDDL.

Figure 5:
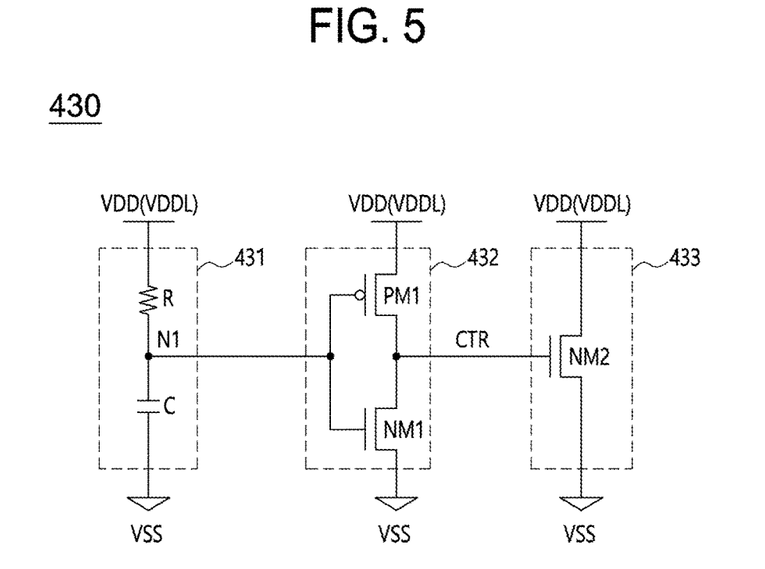
FIG. 5 illustrates a second electrostatic discharge circuit of FIG. 3.

FIG. 5 is a circuit diagram illustrating the second electrostatic discharge circuit 430 of FIG. 3.

Referring to FIG. 5, the second electrostatic discharge circuit 430 may include a detection circuit 431, a driving circuit 432, and a discharge circuit 433. The second electrostatic discharge circuit 430 may receive the second supply voltage VDDL through the supply voltage terminal VDD.

The detection circuit 431 may be configured to detect static electricity contained in the second supply voltage VDDL. The detection circuit 431 may include a resistor R and a capacitor C, which are coupled in series between the supply voltage terminal VDD and the ground voltage terminal.

The driving circuit 432 may be configured to generate a control signal CTR based on an output signal of the detection circuit 431. The driving circuit 432 may include a first PMOS transistor PM1 and a first NMOS transistor NM1, which are coupled in series between the supply voltage terminal VDD and the ground voltage terminal.

The discharge circuit 433 may be configured to form a discharge path for the second supply voltage VDDL in response to the control signal CTR. The discharge circuit 433 may include a second NMOS transistor NM2 coupled between the supply voltage terminal VDD and the ground voltage terminal.

The second electrostatic discharge circuit 430 may receive the second supply voltage VDDL and perform a discharge operation on the second supply voltage VDDL. The first and second NMOS transistors NM1 and NM2 and the first PMOS transistor PM1 may be low voltage transistors.

Hereafter, overall circuit operations of the electrostatic discharge control system 400 of FIG. 3 will be described with reference to FIGS. 3 to 5.

First, the case in which the first supply voltage VDDH corresponding to a high voltage is applied to the supply voltage terminal VDD will be described as follows.

As described above, the selection control circuit 410 of FIG. 4 may output the first supply voltage VDDH as the output voltage when the first supply voltage VDDH is applied to the supply voltage terminal VDD. Therefore, the first electrostatic discharge circuit 420 may be activated, and the second electrostatic discharge circuit 430 may be inactivated. Then, the first electrostatic discharge circuit 420 of FIG. 3 receiving the first supply voltage VDDH may perform the discharge operation described with reference to FIG. 2. Therefore, static electricity contained in the first supply voltage VDDH may be discharged to the ground voltage VSS.

Next, the case in which the second supply voltage VDDL corresponding to a low voltage is applied to the supply voltage terminal VDD will be described as follows.

As described above, the selection control circuit 410 of FIG. 4 may output the second supply voltage VDDL as the output voltage when the second supply voltage VDDL is applied to the supply voltage terminal VDD. Therefore, the first electrostatic discharge circuit 420 may be inactivated, and the second electrostatic discharge circuit 430 may be activated.

Referring to FIG. 5, when no static electricity is contained in the second supply voltage VDDL, a first node N1 of the detection circuit 431 may have a voltage level corresponding to the second supply voltage VDDL because the capacitor C is opened. That is, the first node N1 may have a logic high level. Then, the driving circuit 432 may generate the control signal CTR having a logic low level in response to the logic high level on the first node N1, which is the output signal of the detection circuit 431. At this time, the second NMOS transistor NM2 of the discharge circuit 433 may maintain a turn-off state in response to the control signal CTR having the logic low level.

When static electricity is contained in the second supply voltage VDDL, the first node N1 of the detection circuit 431 may have a voltage level corresponding to the ground voltage VSS because the capacitor C is shorted. That is, the first node N1 may have a logic low level. Then, the driving circuit 432 may generate the control signal CTR having a logic high level in response to the logic low on the first node N1, which is the output signal of the detection circuit 431. Then, the second NMOS transistor NM2 of the discharge circuit 433 may be turned on in response to the control signal CTR having the logic high level. Therefore, the static electricity contained in the second supply voltage VDDL may be discharged to the ground voltage VSS.

As described above, when the second supply voltage VDDL corresponding to a low voltage is applied to the supply voltage terminal VDD, the second electrostatic discharge circuit 430 may be activated. In this case, the first electrostatic discharge circuit 420 may be inactivated. For this operation, the control voltage generation circuit 310 of FIG. 2 may be modified to have the same configuration as FIG. 6. Before description, the control voltage generation circuit 310 may be inactivated when the second supply voltage VDDL is applied to the supply voltage terminal VDD.

Figure 6:
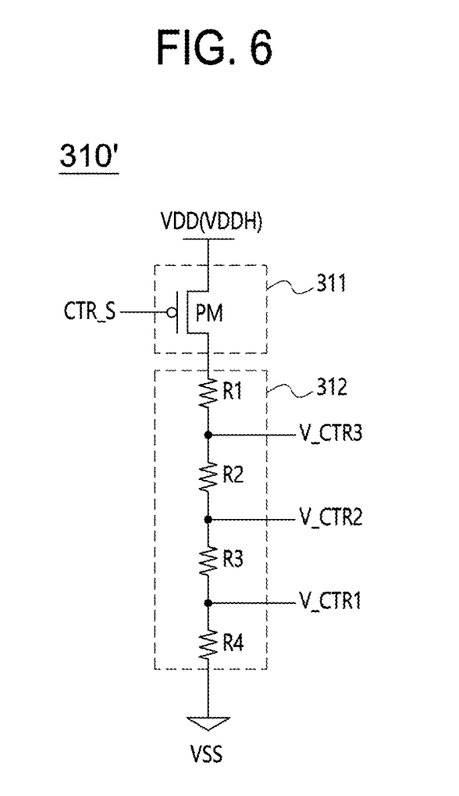
FIG. 6 illustrates a control voltage generation circuit in accordance with another embodiment.

FIG. 6 is a circuit diagram illustrating a control voltage generation circuit 310' in accordance with another embodiment.

Referring to FIG. 6, the control voltage generation circuit 310' may include a transfer circuit 311 and a voltage dividing circuit 312.

The transfer circuit 311 may be configured to transfer the first supply voltage VDDH received through the supply voltage terminal VDD in response to the selection control signal CTR_S. The transfer circuit 311 may include a PMOS transistor PM which has source and drain terminals coupled between the supply voltage terminal VDD and the voltage dividing circuit 312 and a gate terminal configured to receive the selection control signal CTR_S. The selection control signal CTR_S may correspond to the selection control signal CTR_S of FIG. 4.

The voltage dividing circuit 312 may be configured to receive a voltage transferred through the transfer circuit 311, and generate the first to third control voltages V_CTR1 to V_CTR3. The voltage dividing circuit 312 may include first to fourth resistors R1 to R4 which are coupled in series between the PMOS transistor PM and the ground voltage terminal.

Referring to FIGS. 4 and 6, the circuit operation of the control voltage generation circuit 310' will be described as follows.

When the first supply voltage VDDH corresponding to a high voltage is applied to the supply voltage terminal VDD, the control circuit 413 of FIG. 4 may generate the selection control signal CTR_S having the logic low level. Then, the PMOS transistor PM of FIG. 6 may be turned on in response to the selection control signal CTR_S having the logic low level. Therefore, when the first supply voltage VDDH is applied to the supply voltage terminal VDD, the control voltage generation circuit 310' may generate the first to third control voltages V_CTR1 to V_CTR3 through a voltage division operation. Since the voltage division operation for generating the first to third control voltages V_CTR1 to V_CTR3 and the discharge operation using the first to third control voltages V_CTR1 to V_CTR3 have been sufficiently described with reference to FIG. 2, the detailed descriptions thereof will be omitted herein.

When the second supply voltage VDDL corresponding to a low voltage is applied to the supply voltage terminal VDD, the selection control signal CTR_S may have the logic high level. The PMOS transistor PM of FIG. 6 may be turned off in response to the selection control signal CTR_S having the logic high level. Therefore, the control voltage generation circuit 310' may be inactivated when the second supply voltage VDDL is applied to the supply voltage terminal VDD. Since the first to third control voltages V_CTR1 to V_CTR3 become to have a logic low level when the control voltage generation circuit 310' is inactivated, the electrostatic detection circuit 320, the driving control circuit 330, and the discharge driving circuit 340 of FIG. 2, which are included in the first electrostatic discharge circuit 420 of FIG. 3, may also be inactivated.

Figure 7:
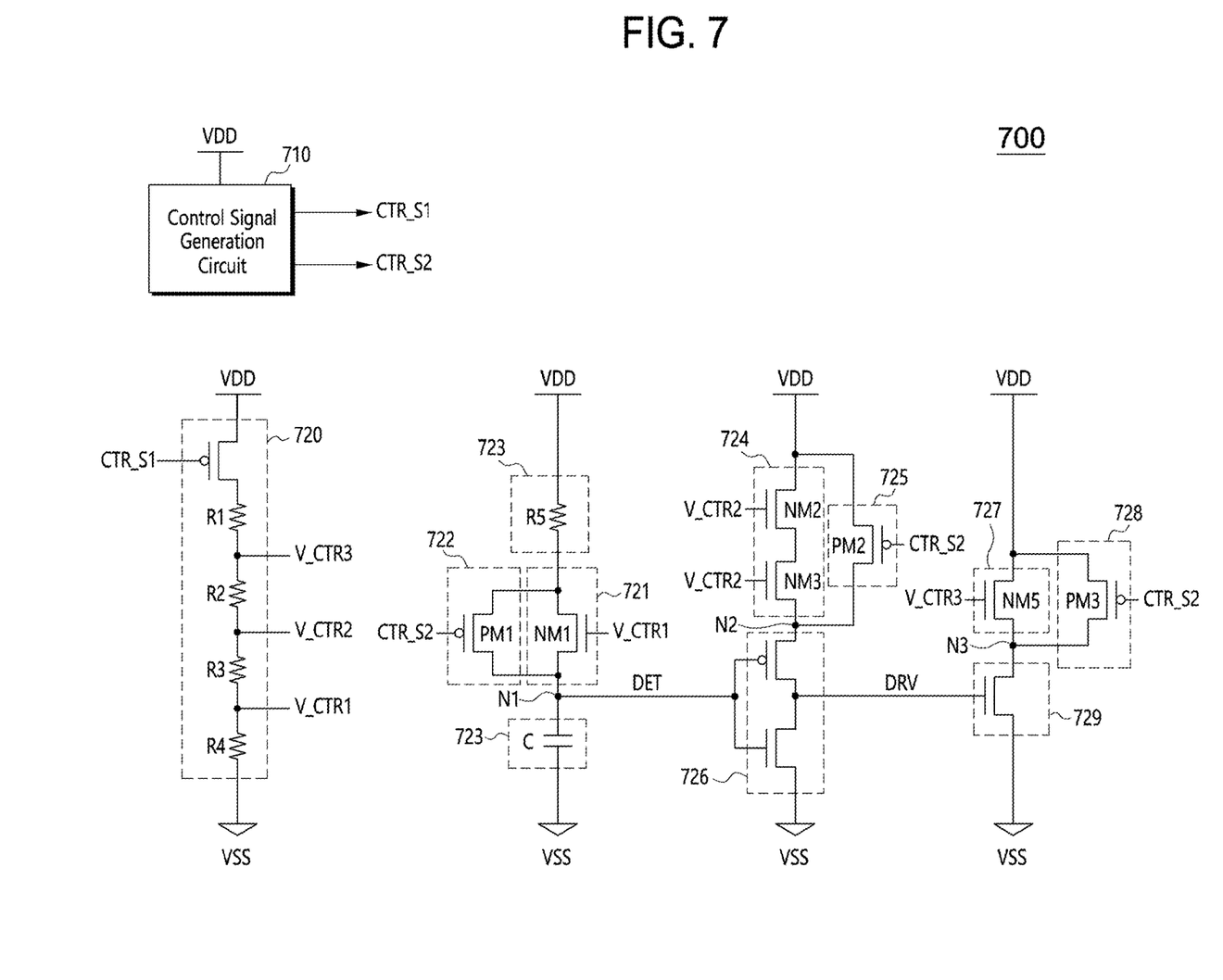
FIG. 7 illustrates an electrostatic discharge control system in accordance with another embodiment.

FIG. 7 is a block diagram illustrating an electrostatic discharge control system 700 in accordance with another embodiment.

Referring to FIG. 7, the electrostatic discharge control system 700 may be configured to control a discharge operation on static electricity contained in multiple supply voltages in an integrated circuit which receives the multiple supply voltages through a supply voltage terminal VDD. In the electrostatic discharge control system 700, a first supply voltage VDDH or a second supply voltage VDDL may be applied to the supply voltage terminal VDD as in the electrostatic discharge control system 400 of FIG. 3.

The electrostatic discharge control system 700 may include a control signal generation circuit 710, a control voltage generation circuit 720, a first setup circuit 721, a first transfer circuit 722, a common detection circuit 723, a second setup circuit 724, a second transfer circuit 725, a common driving circuit 726, a third setup circuit 727, a third transfer circuit 728, and a common discharge circuit 729.

The control signal generation circuit 710 may be configured to generate first and second selection control signals CTR_S1 and CTR_S2 based on one supply voltage of the first and second supply voltages VDDH and VDDL, which is applied to the supply voltage terminal VDD. The first and second selection control signals CTR_S1 and CTR_S2 may have an inverse relationship. The first and second selection control signals CTR_S1 and CTR_S2 may be transferred through signal lines separated from each other. In another embodiment, the first and second selection control signals CTR_S1 and CTR_S2 may be transferred through the same signal line, and the second selection control signal CTR_S2 may be an inverted signal of the first selection control signal CTR_S1, or vice versa.

Figure 8:
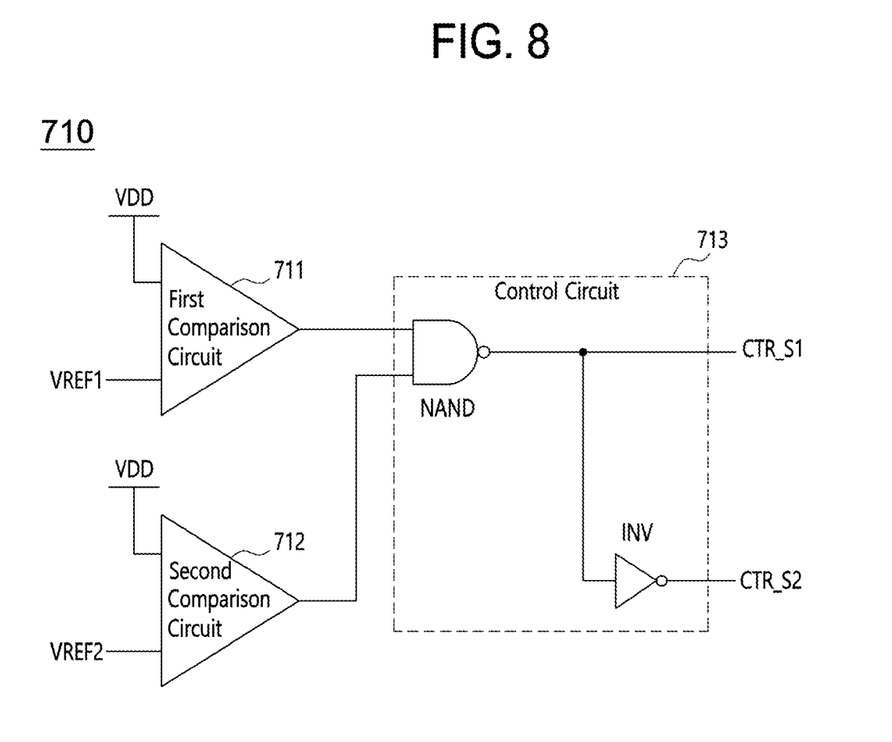
FIG. 8 illustrates a control signal generation circuit of FIG. 7.

FIG. 8 illustrates the control signal generation circuit 710 of FIG. 7.

Referring to FIG. 8, the control signal generation circuit 710 may include a first comparison circuit 711, a second comparison circuit 712, and a control circuit 713. The control signal generation circuit 710 may have a similar configuration to the selection control circuit 410 of FIG. 4 except the first and second PMOS transistors PM1 and PM2.

When the first supply voltage VDDH is applied to the supply voltage terminal VDD, the control signal generation circuit 710 may generate the first selection control signal CTR_S1 having a logic low level and the second selection control signal CTR_S2 having a logic high level. On the other hand, when the second supply voltage VDDL is applied to the supply voltage terminal VDD, the control signal generation circuit 710 may generate the first selection control signal CTR_S1 having a logic high level and the second selection control signal CTR_S2 having a logic low level.

Referring back to FIG. 7, the control voltage generation circuit 720 may be activated or inactivated in response to the first selection control signal CTR_S1, and generate first to third control voltages V_CTR1 to V_CTR3 by performing a voltage division operation on the supply voltage transferred through the supply voltage terminal VDD. The control voltage generation circuit 720 may correspond to the control voltage generation circuit 310 of FIG. 6. However, the control voltage generation circuit 720 may receive the first selection control signal CTR_S1 instead of the selection control signal CTR_S, unlike the control voltage generation circuit 310 of FIG. 6.

As described above, the first selection control signal CTR_S1 may have the logic low level when the first supply voltage VDDH is applied to the supply voltage terminal VDD. Therefore, the control voltage generation circuit 720 may be activated when the first supply voltage VDDH is applied to the supply voltage terminal VDD. Thus, the control voltage generation circuit 720 may generate the first to third control voltages V_CTR1 to V_CTR3 by performing the voltage division operation on the first supply voltage VDDH. On the other hand, the first selection control signal CTR_S1 may have the logic high level when the second supply voltage VDDL is applied to the supply voltage terminal VDD. Therefore, the control voltage generation circuit 720 may be inactivated.

The first setup circuit 721, the common detection circuit 723, the second setup circuit 724, the common driving circuit 726, the third setup circuit 727, and the common discharge circuit 729 may correspond to the first setup circuit 321, the common detection circuit 322, the second setup circuit 331, the common driving circuit 332, the third setup circuit 341, and the common discharge circuit 342 of FIG. 2, respectively.

However, the common detection circuit 723, the common driving circuit 726, and the common discharge circuit 729 may be used in common when the first and second supply voltages VDDH and VDDL are applied to the supply voltage terminal VDD. That is, the common detection circuit 723, the common driving circuit 726, and the common discharge circuit 729 may be used for performing a discharge operation on the first supply voltage VDDH and a discharge operation on the second supply voltage VDDL. Therefore, the electrostatic discharge control system 700 in accordance with the present embodiment may minimize a circuit area occupied by a circuit required for performing the discharge operation on multiple supply voltages including the first and second supply voltages VDDH and VDDL.

The first transfer circuit 722 may be coupled in parallel to the first setup circuit 721, and transfer, as a first setup voltage, a supply voltage applied through the supply voltage terminal VDD in response to the second selection control signal CTR_S2. The first transfer circuit 722 may include a first PMOS transistor PM1. The first PMOS transistor PM1 may be coupled between a fifth resistor R5 and a first node N1, and receive the second selection control signal CTR_S2 through a gate terminal thereof.

As described above, when the second supply voltage VDDL is applied to the supply voltage terminal VDD, the second selection control signal CTR_S2 may have the logic low level. The first PMOS is transistor PM1 may be turned on in response to the second selection control signal CTR_S2 having the logic low level. At this time, a first NMOS transistor NM1 of the first setup circuit 721 may be turned off in response to the first control voltage V_CTR1 having the logic low level. Therefore, the second supply voltage VDDL may be transferred to the first node N1 through the fifth resistor R5 and the first PMOS transistor PM1.

The second transfer circuit 725 may be coupled in parallel to the second setup circuit 724, and transfer, as a second setup voltage, the supply voltage applied through the supply voltage terminal VDD in response to the second selection control signal CTR_S2. The second transfer circuit 725 may include a second PMOS transistor PM2. The second PMOS transistor PM2 may be coupled between the supply voltage terminal VDD and a second node N2, and receive the second selection control signal CTR_S2 through a gate terminal thereof. Therefore, when the second supply voltage VDDL is applied to the supply voltage terminal VDD, the second PMOS transistor PM2 may be turned on in response to the second selection control signal CTR_S2 having the logic low level. At this time, second and third NMOS transistors NM2 and NM3 may be turned off in response to the second control voltage V_CTR2 having the logic low level. Thus, the second supply voltage VDDL may be transferred to the second node N2 through the second PMOS transistor PM2.

The third transfer circuit 728 may be coupled in parallel to the third setup circuit 727, and transfer, as a third setup voltage, the is supply voltage applied through the supply voltage terminal VDD in response to the second selection control signal CTR_S2. The third transfer circuit 728 may include a third PMOS transistor PM3. The third PMOS transistor PM3 may be coupled between the supply voltage terminal VDD and a third node N3, and receive the second selection control signal CTR_S2 through a gate terminal thereof. Therefore, when the second supply voltage VDDL is applied to the supply voltage terminal VDD, the third PMOS transistor PM3 may be turned on in response to the second selection control signal CTR_S2 having the logic low level. At this time, a fifth NMOS transistor NM5 may be turned off based on the third control voltage V_CTR3 having the logic low level. Thus, the second supply voltage VDDL may be transferred to the third node N3 through the third PMOS transistor PM3.

The first to third PMOS transistors PM1 to PM3 may each have a reliability guarantee condition depending on operation characteristics thereof, like the NMOS transistors included in the electrostatic discharge control system 700. That is, low voltage transistors may be used as the first to third PMOS transistors PM1 to PM3.

In short, the NMOS transistors and the PMOS transistors in the electrostatic discharge control system 700 in accordance with the present embodiment may be low voltage transistors. Furthermore, although the first supply voltage VDDH or the second supply voltage VDDL is applied to the supply voltage terminal VDD, the electrostatic discharge control system 700 may perform a discharge operation on static electricity contained in the first supply voltage VDDH or the second supply voltage VDDL. The electrostatic discharge control system 700 may further include the common detection circuit 723, the common driving circuit 726, and the common discharge circuit 729 that are used when any of the first and second supply voltages VDDH and VDDL is applied to the voltage supply terminal VDD.

As described above, the electrostatic discharge control system 700 may perform the discharge operation on both of the first and second supply voltages VDDH and VDDL. Therefore, the electrostatic discharge control system 700 can be implemented in the minimum circuit area.

Figure 9:
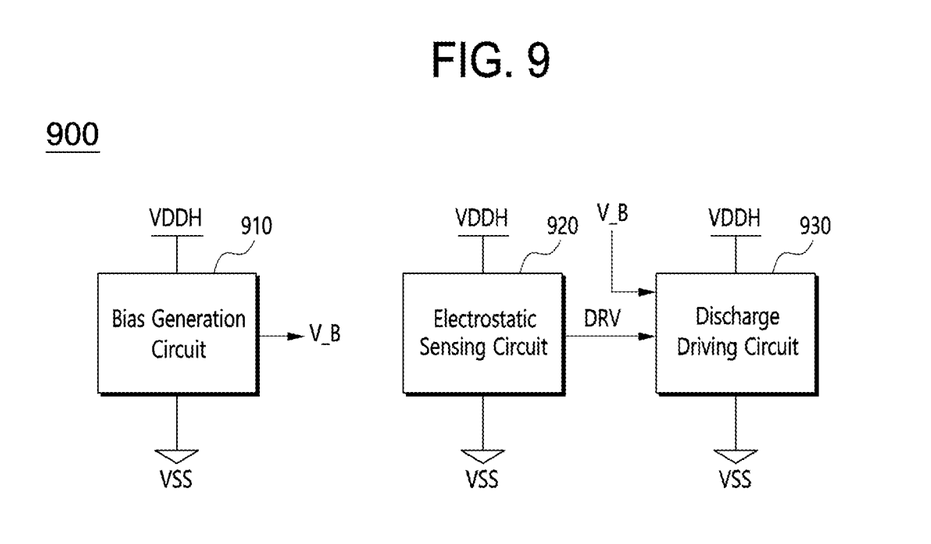
FIG. 9 is a block diagram illustrating an electrostatic discharge circuit in accordance with another embodiment.

FIG. 9 is a block diagram illustrating an electrostatic discharge circuit 900 in accordance with another embodiment.

Referring to FIG. 9, the electrostatic discharge circuit 900 may be configured to sense and discharge static electricity contained in a supply voltage VDDH. More specifically, the electrostatic discharge circuit 900 may include a bias generation circuit 910, an electrostatic sensing circuit 920, and a discharge driving circuit 930.

The bias generation circuit 910 may be configured to generate a bias voltage V_B. The bias generation circuit 910 may be coupled between a supply voltage terminal to which the supply voltage VDDH is applied and a ground voltage terminal to which the ground voltage VSS is applied. The bias generation circuit 910 may correspond to the control voltage generation circuit 310 of FIG. 1. Thus, the bias voltage V_B may correspond to one of the first to third control voltages V_CTR1 to V_CTR3 of FIG. 1.

The electrostatic sensing circuit 920 may be configured to sense static electricity contained in the supply voltage VDDH and generate a driving control signal DRV. The electrostatic sensing circuit 920 may include the electrostatic detection circuit 320 and the driving control circuit 330 of FIG. 1.

The discharge driving circuit 930 may be configured to set a setup voltage based on the bias voltage V_B, and perform a discharge operation on static electricity contained in the setup voltage based on the driving control signal DRV. The discharge driving circuit 930 may correspond to the discharge driving circuit 340 of FIG. 1. However, the discharge driving circuit 930 of FIG. 9 may receive the bias voltage V_B instead of the third control voltage V_CTR3 of FIG. 1, unlike the discharge driving circuit 340 of FIG. 1.

The electrostatic discharge circuit 900 in accordance with the present embodiment may set the setup voltage of the discharge driving circuit 930 in response to the bias voltage V_B. Furthermore, the electrostatic discharge circuit 900 may perform a discharge operation on the static electricity contained in the setup voltage.

In accordance with the above-described embodiments, the electrostatic discharge circuit and the electrostatic discharge control system can protect internal circuits of an integrated circuit from the static electricity contained in the supply voltage, thereby guaranteeing a stable circuit operation.

Furthermore, low voltage transistors may be used to implement the electrostatic discharge circuit and the electrostatic discharge control system. Thus, it is possible to minimize the circuit areas of the electrostatic discharge circuit and the electrostatic discharge control system.

While various embodiments have been described above, it will be understood to those skilled in the art that the embodiments described are examples only. Accordingly, the electrostatic discharge circuit and the electrostatic discharge control system, which have been described herein, should not be limited based on the described embodiments.

What is claimed is:

1. An electrostatic discharge circuit, comprising:
    a control voltage generation circuit configured to generate a first control voltage, a second control voltage, and a third control voltage by dividing a supply voltage;
    an electrostatic detection circuit configured to set a first setup voltage based on the first control voltage, and generate an electrostatic detection signal by detecting static electricity included in the first setup voltage;
    a driving control circuit configured to set a second setup voltage in response to the second control voltage, and generate a driving control signal based on the electrostatic detection signal; and
    a discharge driving circuit configured to set a third setup voltage based on the third control voltage, and perform a discharge operation on static electricity included in the third setup voltage based on the driving control signal.

2. The electrostatic discharge circuit according to claim 1, wherein one or more of the first to third control voltages have different voltage levels.

3. The electrostatic discharge circuit according to claim 1, wherein the first to third control voltages have voltage levels sequentially decreasing from a voltage level of the supply voltage.

4. The electrostatic discharge circuit according to claim 1, wherein the electrostatic detection circuit comprises:
    a first setup circuit configured to receive the supply voltage and generate the first setup voltage based on the first control voltage.

5. The electrostatic discharge circuit according to claim 1, wherein the driving control circuit comprises:
    a second setup circuit configured to receive the supply voltage and generate the second setup voltage based on the second control voltage.

6. The electrostatic discharge circuit according to claim 1, wherein the discharge driving circuit comprises:

a third setup circuit configured to receive the supply voltage and generate the third setup voltage based on the third control voltage.

7. The electrostatic discharge circuit according to claim 1, wherein the electrostatic detection circuit comprises a first low voltage transistor configured to receive the first control voltage.

8. The electrostatic discharge circuit according to claim 1, further comprising a reverse discharge circuit configured to discharge static electricity included in a ground voltage to the supply voltage.

9. The electrostatic discharge circuit according to claim 1, wherein the electrostatic detection circuit comprises:
a detection circuit configured to detect the static electricity included in the first setup voltage and output the electrostatic detection signal.

10. The electrostatic discharge circuit according to claim 1, wherein the driving control circuit comprises a driving circuit configured to generate the driving control signal based on the electrostatic detection signal.

11. The electrostatic discharge circuit according to claim 1, wherein the discharge driving circuit comprises a discharge circuit configured to form a discharge path for the third setup voltage based on the driving control signal.

12. The electrostatic discharge circuit according to claim 1, wherein the driving control circuit comprises a second low voltage transistor configured to receive the second control voltage, and a third low voltage transistor configured to receive the electrostatic detection signal.

13. The electrostatic discharge circuit according to claim 1, wherein the discharge driving circuit comprises a fourth low voltage transistor configured to receive the third control voltage, and a fifth low voltage transistor configured to receive the driving control signal.

14. An electrostatic discharge circuit, comprising:
a bias generation circuit configured to generate a bias voltage;
an electrostatic sensing circuit configured to sense static electricity present in a supply voltage and generate a driving control signal; and
a discharge driving circuit configured to set a setup voltage based on the bias voltage, and perform a discharge operation on static electricity present in the setup voltage based on the driving control signal.

15. The electrostatic discharge circuit according to claim 14, wherein the electrostatic sensing circuit comprises:
an electrostatic detection circuit configured to detect the static electricity present in the supply voltage and generate an electrostatic detection signal.

16. The electrostatic discharge circuit according to claim 15, wherein the electrostatic detection circuit comprises:
a first setup circuit configured to receive the supply voltage and generate a first setup voltage based on the bias voltage.

17. The electrostatic discharge circuit according to claim 15, wherein the electrostatic detection circuit comprises:
a detection circuit configured to detect static electricity present in a first setup voltage and output the electrostatic detection signal.

18. The electrostatic discharge circuit according to claim 14, wherein the electrostatic sensing circuit comprises:
a driving control circuit configured to generate the driving control signal based on an electrostatic detection signal.

19. The electrostatic discharge circuit according to claim 18, wherein the driving control circuit comprises:
a second setup circuit configured to receive the supply voltage and generate a second setup voltage based on the bias voltage.

20. The electrostatic discharge circuit according to claim 18, wherein the driving control circuit comprises:
a driving circuit configured to generate the driving control signal based on the electrostatic detection signal.

21. The electrostatic discharge circuit according to claim 14, wherein the bias generation circuit is configured to generate the bias voltage by dividing the supply voltage.

22. The electrostatic discharge circuit according to claim 14, wherein the discharge driving circuit comprises:
a setup circuit configured to receive the supply voltage and generate the setup voltage based on the bias voltage.

23. The electrostatic discharge circuit according to claim 14, wherein the discharge driving circuit comprises:
a discharge circuit configured to form a discharge path for the setup voltage based on the driving control signal.

24. The electrostatic discharge circuit according to claim 14, wherein the discharge driving circuit comprises:
a first low voltage transistor configured to receive the bias voltage.

25. The electrostatic discharge circuit according to claim 14, wherein the discharge driving circuit comprises:
a second low voltage transistor configured to receive the driving control signal.

26. The electrostatic discharge circuit according to claim 14, further comprising a reverse discharge circuit configured to discharge static electricity present in a ground voltage to the supply voltage.

* * * * *